United States Patent [19]

Inoue

[11] Patent Number: 5,134,372
[45] Date of Patent: Jul. 28, 1992

[54] IMAGING METHOD OF WATER/FAT SEPARATION IN MRI

[75] Inventor: Yuji Inoue, Tokyo, Japan

[73] Assignee: Yokogawa Medical Systems, Limited, Tokyo, Japan

[21] Appl. No.: 613,760

[22] PCT Filed: May 31, 1989

[86] PCT No.: PCT/JP89/00542

§ 371 Date: Nov. 23, 1990

§ 102(e) Date: Nov. 23, 1990

[87] PCT Pub. No.: WO89/11822

PCT Pub. Date: Dec. 14, 1989

[30] Foreign Application Priority Data

May 31, 1988 [JP] Japan .................. 63-134261

[51] Int. Cl.⁵ .......................................... G01R 33/20
[52] U.S. Cl. .................................................... 324/309
[58] Field of Search ............... 324/300, 307, 309, 310, 324/311, 312, 313, 314, 318, 322; 128/653 A, 653 SC

[56] References Cited

U.S. PATENT DOCUMENTS

| | | | |
|---|---|---|---|
| 4,628,262 | 12/1986 | Maudsley | 324/309 |
| 4,950,992 | 8/1990 | Nakabayashi et al. | 324/309 |
| 4,983,918 | 1/1991 | Nakabayashi | 324/309 |
| 5,079,505 | 1/1992 | Deimling et al. | 324/311 |

*Primary Examiner*—Michael J. Tokar
*Attorney, Agent, or Firm*—Moonray Kojima

[57] ABSTRACT

An object of the invention is to provide imaging method of separation of water and fat in MRI wherein separation error due to unevenness of the magnetic field or the like is removed and the quantitativeness exists. The invention is characterized in that $S_o$ scan with phases of magnetization vectors of water and fat being coincident at the spin echo signal receiving state, $S_1$ scan with phases of the magnetization vectors being different by 180°, and $S_2$ scan with phases of the magnetization vectors being different by 90° are performed, and quantitative difference of water and fat is calculated from the image data of the $S_1$ scan and the $S_2$ scan and a separation image of water and fat is obtained from the absolute value image of the $S_o$ scan and the $S_1$ scan. According to the invention, since the absolute value images of the $S_o$ scan and the $S_1$ scan are used, separation error due to phase deviation caused by unevenness of the magnetic field or the like is not produced. Moreover, the phase term due to unevenness of the magnetic field is removed from the image data of the $S_o$ scan and the $S_1$ scan, and the quantitative difference of water and fat can be calculated and the water and fat componenets can be identified for the separation images estimated from the absolute value data.

10 Claims, 5 Drawing Sheets

IMAGING METHOD OF WATER/FAT SEPARATION IN MRI

Technical Field

The present invention relates to imaging method of separation of water and fat in MRI (Magnetic Resonance Imaging) so as to obtain a separation image of water and fat in a human body utilizing chemical shift, and more specifically to imaging method of separation of water and fat in MRI with quantitativeness where separation of water and fat is performed accurately.

BACKGROUND ART

In MRI, a separation imaging method is exemplified where chemical shift, i.e., deviation of the resonant frequency of the same type of nucleus due to difference in molecular structure of two components, is utilized, and the same tomography surface in a human body is indicated in separation into a proton image of water only and a proton image of fat only.

First, Dickson method in the prior art being one of the separation imaging method of water and fat will be described referring to FIGS. 4, 5A and 5B. FIG. 4 is a diagram representing pulse sequence of Dickson method in the prior art. In FIG. 4, t is time axis and the applying timing of 90° pulse is made t=0. In the hereinafter description, the static magnetic field direction (being horizontal) is made Z axis, the vertical direction is made Y axis, and the horizontal direction (right-hand system) perpendicular to the Z axis is made X axis. RF designates a RF (Radio-Frequency) wave of Lamour frequency for rotating the magnetization vector of proton directed in the Z-axis direction by prescribed angle in the direction perpendicular thereto, which is called 90° pulse or 180° pulse depending on the rotational angle. SE designates a spin echo signal observed in that 90° pulse in t=0 is applied and then phase of the magnetization vector dispersed in the XY plane due to unevenness of the static magnetic field is inverted by 180° pulse and converged again. Time from 90° pulse until obtaining the spin echo is made $T_E$. In Dickson method, at first, $S_0$ scan is performed in the applying timing of 180° pulse mode $t=T_E/2$ at intermediate time of $T_E$ after applying 90° pulse. Next, $S_1$ scan to apply 180° pulse is performed at time $t=T_E/2-\epsilon$ earlier than $T_E$ by $\epsilon$ after 90° pulse. The time obtaining the spin echo is $t=T_E$ in both $S_0$ scan and $S_1$ scan.

In this case, above-mentioned satisfies following formula.

$$\epsilon = (4 \cdot \sigma \cdot f)^{-1} \quad (1)$$

$\sigma$: chemical shift quantity of water and fat
f: resonant frequency of proton
$\epsilon$ corresponds to phase deviation period of magnetization vector of fat with respect to water, i.e., ¼ of period $1/(\sigma \cdot f)$ of chemical shift. Difference of the resonant frequency of proton in water and fat, i.e., the chemical shift $\sigma$ is about 3.5 ppm. Consequently, when the static magnetic field intensity is 0.5 T (Lamour frequency f=21.3 MHz in $^1$H), $\epsilon$ is about 3.5 msec.

FIGS. 5A and 5B are diagrams each representing the phase relation of the magnetization vectors of water and fat in $S_0$ scan and $S_1$ scan. In FIGS. 5A and 5B, W designates magnetization vector of water and F designates magnetization vector of fat, and X'-Y' coordinates are system of coordinates rotating about the Z axis at rotational speed of magnetization vector of water. In $S_0$ scan of FIG. 5A, at t=0, i.e., at application of 90° pulse, phases of both vectors are coincident. At $t=T_E/2$, phase deviation $\psi$ ($-\pi < \psi \leq \pi$) of magnetization vectors of water and fat is produced due to chemical shift. Phases of both vectors are inverted about Y' axis by 180° pulse from the Y'-axis direction. And then the magnetization vector of fat is rotated by the same amount as that before application of 180°. pulse, and is coincident to the magnetization vector of water in phase at $t=T_E$. In $S_1$ scan of FIG. 5B, 180° pulse is applied at $t=T_E/2-\epsilon$. This is earlier than the $S_0$ scan by $\epsilon$ in time and by $\pi/2$ in angle of phase deviation. Time from the phase inversion by 180° pulse until obtaining the spin echo is longer than time from 90° pulse to 180° pulse by $2\epsilon$. Since the magnetization vector of fat is rotated excessively corresponding to this, the phase deviation of 80° is produced in the magnetization vectors of water and fat at $t=T_E$.

Next, method of signal processing to obtain a separation image from raw data obtained in such manner will be described. Image data by image reconstruction of the raw data obtained by each scan becomes $$S_0 = W + F \quad (2)$$

$$S_1 = W - F \quad (3)$$

Where W ($\geq 0$) is proton density of water, and F ($\geq 0$) is proton density of fat. Consequently, $$W = (S_0 + S_1)/2 \quad (4)$$

$$F = (S_0 - S_1)/2 \quad (5)$$

are calculated per each pixel of matrix of the reconstruction image data thereby image in separation of water and fat can be obtained.

In each scan data, however, since there are 0-degree phase offset being proper to the apparatus and produced in the receiving system or the like and deviation of the center frequency of RF pulse included in the $S_1$ scan data from the Lamour frequency and deviation of phase due to unevenness of the static magnetic field or the like, the actual image data becomes as following formulas.

$$S_0 = (W + F) \, EXP(i\alpha_0) \quad (6)$$

$$S_1 = (W - F) \, EXP\{i(\alpha_0 + 2\theta)\} \quad (7)$$

Where $i^2 = -1$, and EXP($i\alpha_0$) is phase offset component being proper to the apparatus and EXP($i2\theta$) is phase deviation component due to unevenness of the static magnetic field and included in $S_1$ data only. If such phase deviation component exists, separation of formulas (4), (5) cannot be performed well, but separation error of water and fat such as shading is produced. Consequently in the prior art, uneven distribution EXP($i\theta$) of the static magnetic field is previously measured using uniform water phantom, and the phase deviation component of the $S_1$ scan is removed and corrected using this information. In another method, absolute value images of the image data of $S_0$ and $S_1$, $$|S_0| = (S_0 \times S_0^*)^{\frac{1}{2}} W + F \quad (8)$$

$$|S_1| = (S_1 \times S_1^*)^{\frac{1}{2}} = |W - F| \quad (9)$$

are taken, and the phase deviation component is removed and then the separation image of water and fat using this absolute value data.

However, the above-mentioned correction methods have problems as follows. First, in the method using water phantom, on account of variation of permeability and antimagnetic field or the like due to difference of water and a human body in constituent components, the magnetic field distribution state is different at the phantom measuring state and at the photographing state of an article to be inspected. Consequently, exact correction cannot be performed and the separation error cannot be removed completely. Also when range of the phase deviation exceeds $\pm \pi$, the phase jump is produced and the correction becomes difficult resulting in another limitation. Next, in the method using the absolute value image, on account of $|W-F|$, information is lost as to which of water or fat is more. Consequently, the calculation result of $\frac{1}{2}$ of sum and difference of formulas (8) and (9) cannot perform identification as to which is water and which is fat, and it lacks the quantitativeness.

DISCLOSURE OF INVENTION

An object of the invention is to provide imaging method of separation of water and fat in MRI wherein separation error due to unevenness of the magnetic field or the like is removed and the quantitativeness exists.

The invention is characterized in that $S_0$ scan with phases of magnetization vectors of water and fat being coincident at the spin echo signal receiving state, $S_1$ scan with phases of the magnetization vectors being different by 180°, and $S_2$ scan with phases of the magnetization vectors being different by 90° are performed, and quantitative difference of water and fat is calculated from the image data of the $S_1$ scan and the $S_2$ scan and a separation image of water and fat is obtained from the absolute value image of the $S_0$ scan and the $S_1$ scan.

According to the invention, since the absolute value images of the $S_0$ scan and the $S_1$ scan are used, separation error due to phase deviation caused by unevenness of the magnetic field or the like is not produced. Moreover, the phase term due to unevenness of the magnetic field is removed from the image data of the $S_0$ scan and the $S_1$ scan, and the quantitative difference of water and fat can be calculated and the water and fat components can be identified for the separation images estimated from the absolute value data.

BEST MODE FOR CARRYING OUT THE INVENTION

Figure 1:
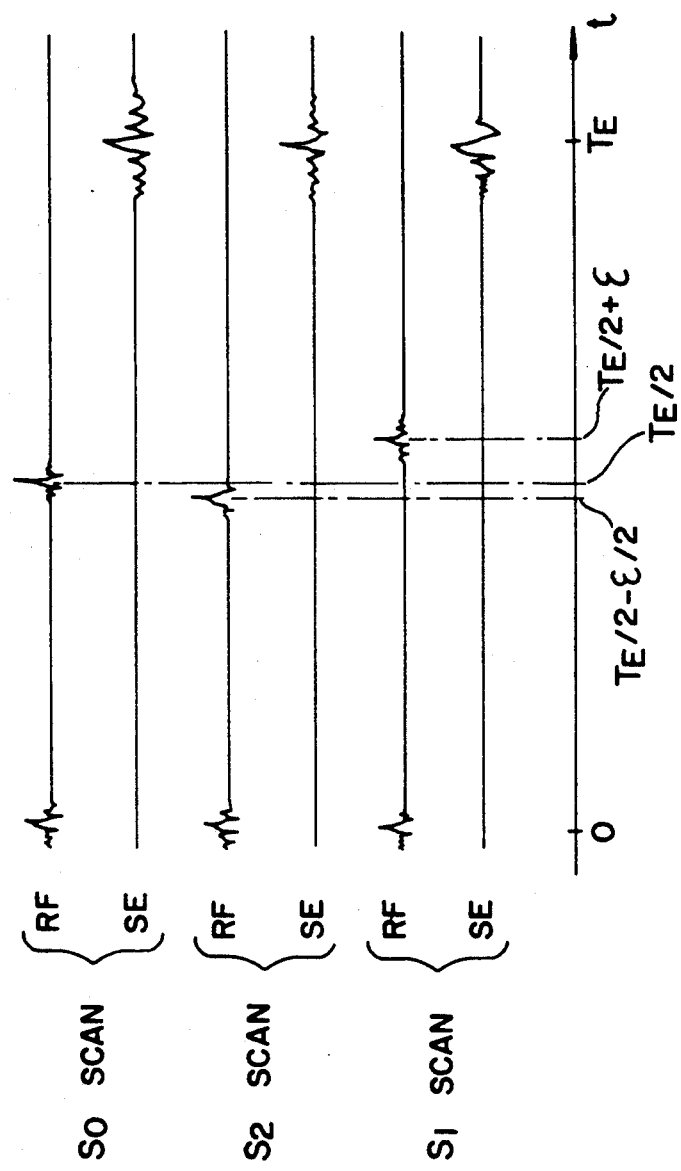
FIG. 1 is a diagram showing pulse sequence of an embodiment of the invention.
Figure 4:
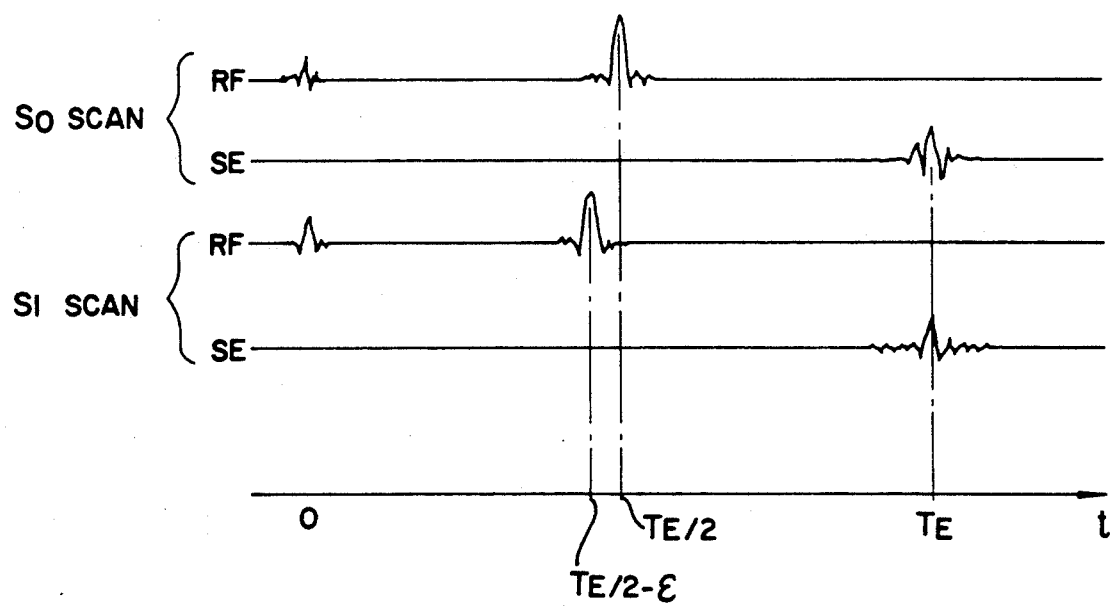
FIG. 4 is a diagram showing pulse sequence of Dickson method in the prior art.
Figure 5A:
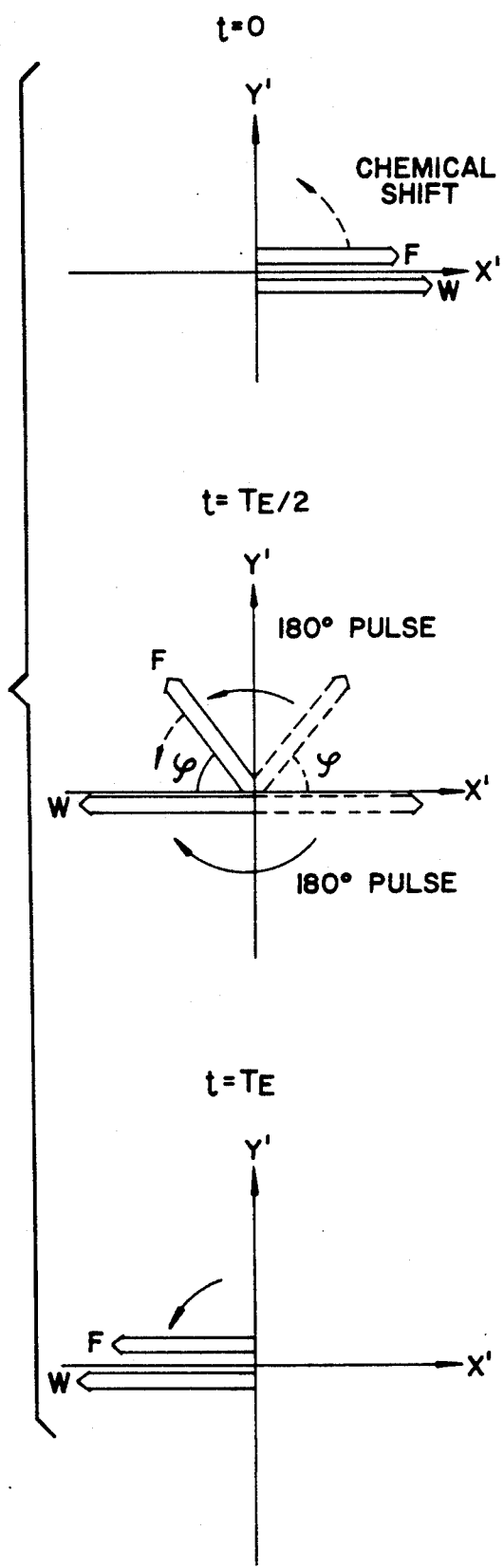
FIGS. 5A and 5B are diagrams showing phase relation of magnetization vectors of water and fat in Dickson method in the prior art.
Figure 5B:
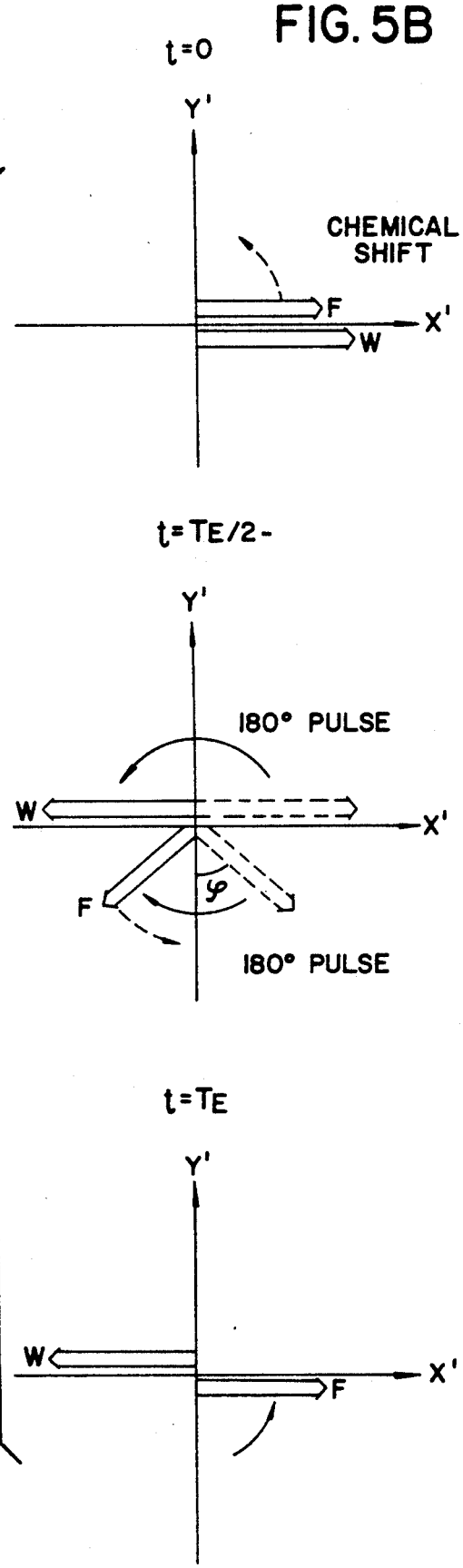

The present invention will now be described in detail referring to the accompanying drawings. FIG. 1 is a diagram showing pulse sequence of an embodiment of the invention. In FIG. 1, symbols are used in the same meaning as that of FIG. 4. In FIG. 1, each of $S_0$ scan and $S_1$ scan is similar to scan sequence of $S_0$ and $S_1$ of Dickson method in the prior art. That is, in the $S_0$ scan, 180° pulse is applied at $t = T_E/2$ so that phases of magnetization vectors of water and fat are coincident at $t = T_E$. In the $S_1$ scan, 180° pulse is applied at $t = T_E/2 + \epsilon$ delayed by $\epsilon$ from the $S_0$ scan state so that phases of both vectors are deviated by 180° at $t = T_E$. Difference from the prior art is in that in addition to the $S_0$ scan and the $S_1$ scan, $S_2$ scan with phases of both vectors deviated by 90° is performed. In the $S_2$ scan, 180° pulse is applied at $t = T_E/2 - \epsilon/2$ earlier than the $S_0$ scan state by $\epsilon/2$, and difference between time from 90° pulse to 180° pulse and time from 180° pulse to SE is made $\epsilon$. Consequently the phase deviation of the magnetization vectors of water and fat at the time $T_E$ becomes 90° being $\frac{1}{2}$ of that at the $S_1$ scan state. Image data by image reconstruction of each scan data becomes $$S_0 = (W+F) \, EXP(i\alpha_0) \quad (10)$$

$$S_1 = (W-F) \, EXP\{i(\alpha_0 - 2\theta)\} \quad (11)$$

$$S_2 = (W+iF) \, EXP\{i(\alpha_0 + \theta)\} \quad (12)$$

Symbols W, F, i, $\alpha_0$, $\theta$ in the above formulas are used similarly to formulas (6), (7).

Figure 2:
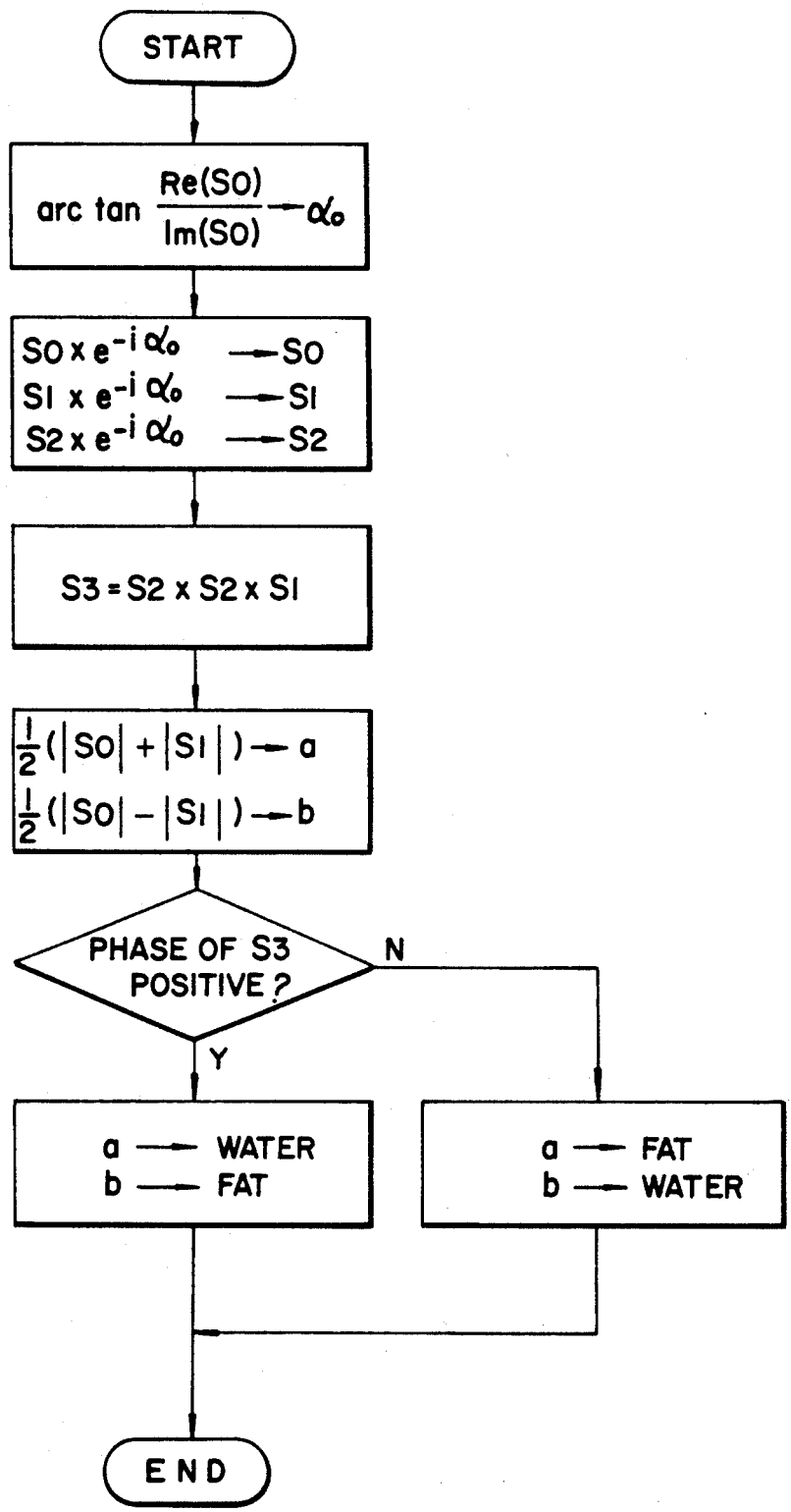
FIG. 2 is a flow chart showing operation of an embodiment of the invention.

Next, method of producing a separation image using these data will be described referring to a flow chart of FIG. 2. The hereinafter description is performed per each pixel of matrix of reconstruction image data. At first, phase term of image data of $S_0$ is estimated from $$Arctan\{Re(S_0)/Im(S_0)\} = \alpha_0$$

$Re(S_9)$ is real part of $S_0$, and $Im(S_0)$ is imaginary part of $S_0$.

Next, in order to remove the 0-degree phase term $EXP(i\alpha_0)$ being proper to the system, $EXP(-i\alpha_0)$ is multiplied to each image data of $S_0$, $S_1$ and $S_2$. As a result, each image data becomes $$S_0 = W + F \quad (13)$$

$$S_1 = (W-F) \, EXP(-2i\theta) \quad (14)$$

$$S_2 = (W+iF) \, EXP(i\theta) \quad (15)$$

Next, in order to estimate which of water or fat is much in quantity, following formula is calculated as $S_3$.

$$\begin{aligned} S_3 &= S_2 \times S_2 \times S_1 \\ &= (W+iF)^2 \times (W-F) \times EXP(i\theta) \times EXP(-2i\theta) \\ &= (W-F)^2 \cdot (W+F) + 2iF \cdot W \cdot (W-F) \end{aligned} \quad (16)$$

In $S_3$, since phase deviation component $EXP(i\theta)$ due to unevenness of the static magnetic field is removed and the real part of the formula (16) is always zero or more, the polarity of phase of $S_3$, i.e., sign of the imaginary part corresponds to difference in quantity of water and fat.

Next, absolute value images of the image data of $S_0$ and $S_1$, $$|S_0| = (S_0 \times S_0^*)^{\frac{1}{2}} = W + F \quad (18)$$

$$|S_1| = (S_1 \times S_1^*)^{\frac{1}{2}} = |W - F| \quad (18)$$

are calculated. In order to separate water and fat, $$a = (|S_0| + |S_1|)/2 \quad (19)$$

$$b = (|S_0| - |S_1|)/2 \quad (20)$$

are also calculated.

Finally, in the formulas (19) and (20), in order to identify as to which is water and which is fat, phase of the $S_3$ data will be estimated. When sign of the imaginary part is positive, i.e., when $W > F$, it follows that $|W - F| = W - F$, and in the formulas (19), (20), a becomes water and b becomes fat. On the contrary, when sign of the imaginary part is negative, i.e., when $W < F$, since $W - F = F - W$, a becomes water and b becomes fat respectively. In this case, since there is no fat component excluding water component in a human body, when the imaginary part of the formula (16) is 0, decision may be effected that $F = 0$, i.e., a is water. Finally, separation images of water and fat will be displayed based on the image data of water component and fat component obtained as above described.

Thus in the separation imaging method of the embodiment, product of square of the image data of the $S_2$ scan and the image data of the $S_1$ scan is calculated, thereby phase deviation component due to unevenness of the static magnetic field or the like is removed, and difference in quantity of water and fat can be known from sign of the imaginary part. From this result, identification of the water and fat components is performed for the separation image obtained from the absolute value data. Consequently, although the absolute value image to enable removal of the phase deviation component due to unevenness of the static magnetic field of $S_1$ is used, the separation image can be obtained without losing the quantitative information.

Figure 3A:
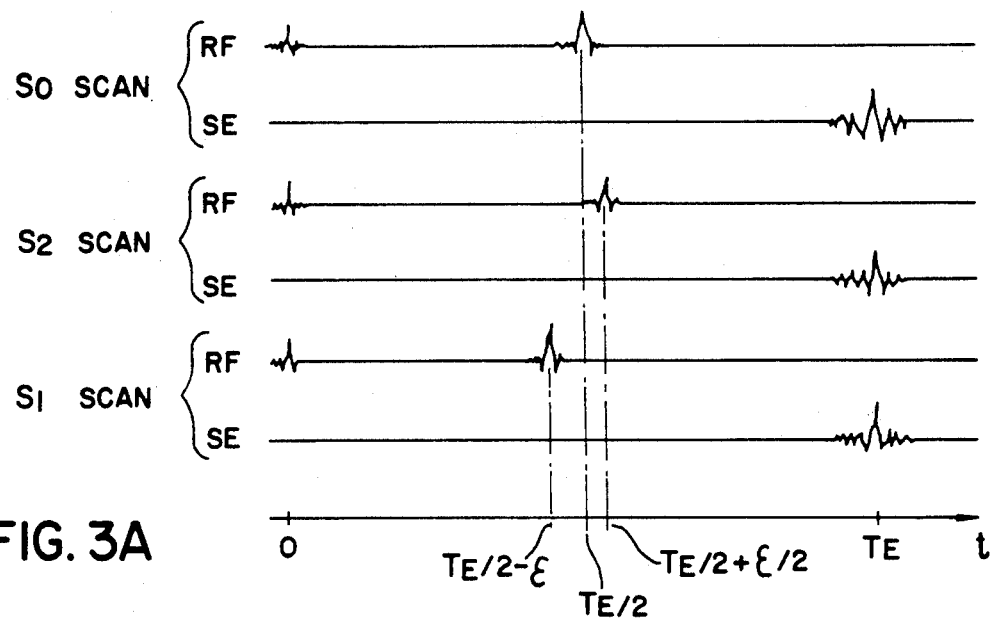
FIGS. 3A, 3B and 3C are diagrams showing pulse sequence of another embodiment of the invention.
Figure 3B:
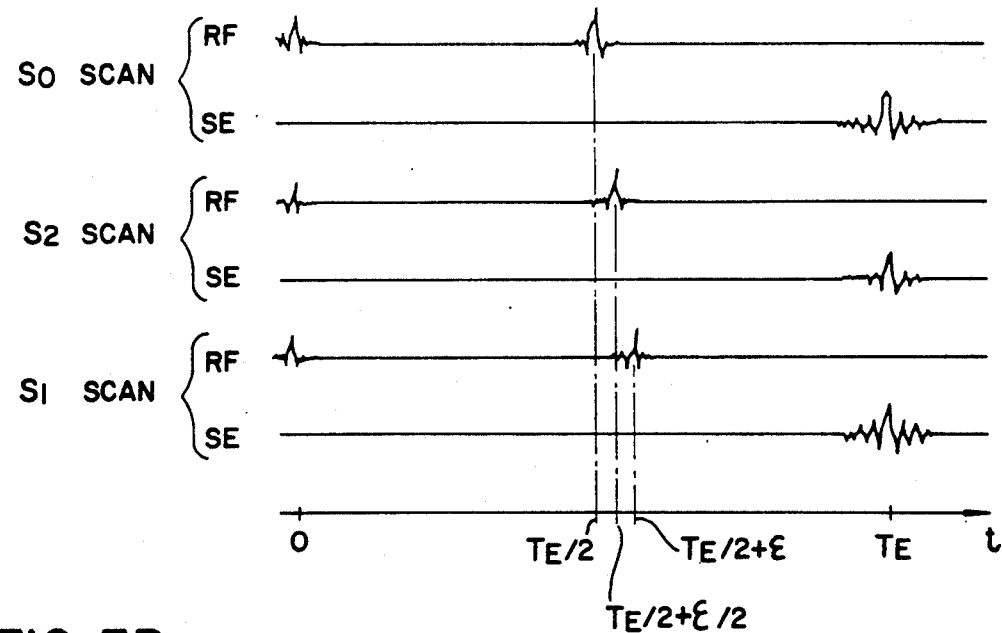
Figure 3C:
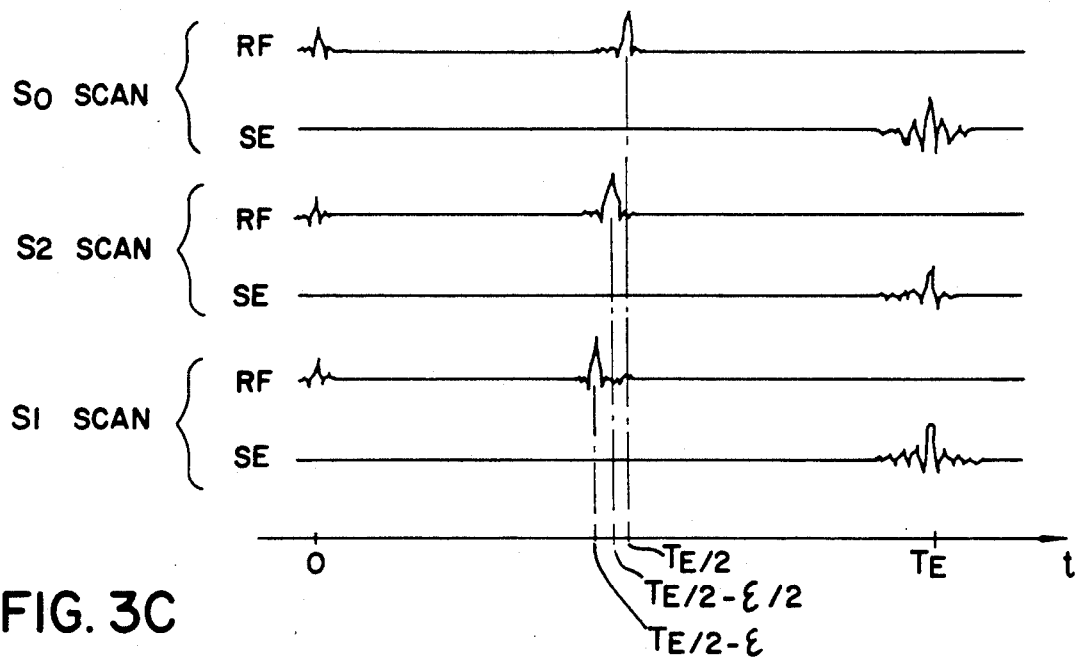

FIGS. 3A to 3C are diagrams showing pulse sequence of another embodiment of the invention. Symbols in these figures are used similarly to FIG. 1. In the above-mentioned embodiment, at the $S_1$ scan, 180° pulse is applied later by $\epsilon$ than the $S_0$ scan state, and at the $S_2$ scan, 180° pulse is applied earlier by $\epsilon/2$. On the contrary, as shown in FIG. 3A, at the $S_1$ scan, 180° pulse may be applied at $t = T_E/2 - \epsilon$ being earlier than the $S_0$ scan state by $\epsilon$, and at the $S_2$ scan, 180° pulse may be applied at $t = T_E/2 + \epsilon/2$ being later by $\epsilon/2$. In this case, the formulas (11), (12), (16) respectively become $$S_1 = (W - F) \, EXP\{i(\alpha_0 + 2\theta)\} \quad (21)$$

$$S_2 = (W - iF) \, EXP\{i(\alpha_0 - \theta)\} \quad (22)$$

$$S_3 = (W - F)^2 \cdot (W + F) - 2iF \cdot W \cdot (W - F) \quad (23)$$

and sign of the imaginary part of $S_3$ becomes reverse to formula (16). Further as shown in FIG. 3B, at the $S_1$ scan, application timing of 180° pulse may be made $t = T_E/2 + \epsilon$ being later than the $S_0$ scan state by $\epsilon$, and at the $S_2$ scan, application timing of 180° pulse may be made $t = T_E/2 + \epsilon/2$ being later by $\epsilon/2$. Or as shown in FIG. 3C, at the $S_1$ scan, application timing of 180° pulse may be made $t = T_E/2 - \epsilon$ being earlier than the $S_0$ scan state by $\epsilon$, and at the $S_2$ scan, application timing of 180° pulse may be made $t = T_E/2 - \epsilon/2$ being earlier by $\epsilon/2$. In the case of each of FIGS. 3B and 3C, $S_3$ is calculated by $$S_3 = S_2 \times S_2/S_1 \quad (24)$$
$$= (W + F) \pm 2iF \cdot W/(W - F)$$

In formula (24), sign $\pm$ of the imaginary part becomes $-$ in the case of FIG. 3B, and becomes $+$ in the case of FIG. 3C. When $W = F$, since formula (24) diverges, case dividing is required. Also in formula (24), the phase deviation component due to unevenness of the static magnetic field or the like is removed, and quantitative difference of water and fat can be known from sign of the imaging part. In order to reduce the scan time, in one of the $S_1$ scan and the $S_2$ scan or both of them, data collection may be performed at the data matrix number less than the data number of the $S_0$ scan, and at the image reconstruction state, zero data may be entered in the remaining region so as to obtain the image data.

As above described, according to the imaging method of separation of water and fat in MRI of the invention, following effects can be obtained.

(1) The phase deviation component due to unevenness of the static magnetic field or the like is removed from the image data of the $S_1$ scan and the $S_2$ scan, and quantitative difference of water and fat can be known from phase of the calculation result. From this result, identification of the water and fat components can be performed exactly for the separation images using the absolute value images obtained from the $S_0$ scan and the $S_1$ scan. Consequently, although the absolute value data are used, the exact separation of water and fat can be performed and the separation images can be obtained without losing the quantitative information.

(2) Since the absolute value images of the $S_0$ scan and the $S_1$ scan are used, the 0-degree phase offset being proper to the apparatus and deviation of the center frequency of RF pulse from the Lamour frequency and the phase deviation due to unevenness of the static magnetic field or the like can be removed. In this case, even if range of the phase deviation exceeds $\pm \pi$, it is not affected thereby the range of the phase deviation capable of being corrected is not limited. As a result, separation error of water and fat, such as shading can be removed, and the quality of the separation image can be improved.

The best mode for carrying out the invention has been described, but various modifications can be done easily by those skilled in the art without departing from the following claims.

What is claimed is:

1. Imaging method of separation of water and fat in MRI, wherein a static magnetic field being nearly uniform in the axial direction is applied, and RF pulse of 90° with respect to the perpendicular direction to the Z axis is applied to an article to be inspected in the static magnetic field, and after lapse of prescribed time, RF pulse of 180° is applied, and SE method to receive spin echo signal from the article is used, characterized in that $S_0$ scan with phases of magnetization vectors of water and fat being coincident at the spin echo signal receiving state, $S_1$ scan with phases of the magnetization vectors being different by 180°, and $S_2$ scan with phases of the magnetization vectors being different by 90° are performed, and quantitative difference of water and fat is calculated from the image data of the $S_1$ scan and the $S_2$ scan and a separation image of water and fat is obtained from the absolute value image of the $S_0$ scan and the $S_1$ scan.

2. Imaging method of separation of water and fat in MRI as set forth in claim 1, characterized in that 0-degree phase offset quantity being proper to the apparatus is estimated from phase of result of the image data of the $S_0$ scan, and in response to this, correction is performed to each image data.

3. Imaging method of separation of water and fat in MRI as set forth in claim 1 or 2, characterized in that identification is performed as to which is water component and which is fat component for ½ of sum of absolute value images of the $S_0$ scan and the $S_1$ scan and ½ of difference of the absolute value images from quantitative difference of water and fat.

4. Imaging method of separation of water and fat in MRI as set forth in claims 1 or 2, characterized in that in one of the $S_1$ scan and the $S_2$ scan or both of them, data collection is performed at the data matrix number less than the data number of the $S_0$ scan, and at the image reconstruction state, zero data is entered in the remaining region.

5. Imaging method of separation of water and fat in MRI as set forth in claims 1 or 2, characterized in that in the $S_1$ scan and the $S_2$ scan, application timing of RF pulse of 180° in the $S_1$ scan is made earlier or later by $\epsilon$ than that in the $S_0$ scan, and the application timing in the $S_2$ scan is made earlier or later by $\epsilon/2$, where $\epsilon$ satisfies following formula:

$$\epsilon = (4 \cdot \sigma \cdot f)^{-1}$$

$\sigma$: chemical shift quantity of water and fat
f: resonant frequency of proton.

6. Imaging method of separation of water and fat in MRI as set forth in claim 5, characterized in that in the $S_1$ scan and the $S_2$ scan, when application timing of RF pulse of 180° in the $S_1$ scan is made earlier by $\epsilon$ than that in the $S_0$ scan, the timing in the $S_2$ scan is made later by $\epsilon/2$, and when application timing of 180° in the $S_1$ scan is made later by $\epsilon$, the timing in the $S_2$ scan is made earlier by $\epsilon/2$.

7. Imaging method of separation of water and fat in MRI as set forth in claim 6, characterized in that product of square of the image data of the $S_2$ scan and the image data of the $S_1$ scan is calculated from the results of the $S_1$ scan and the $S_2$ scan, and difference in quantity of water and fat is estimated from phase of the calculation result.

8. Imaging method of separation of water and fat in MRI as set forth in claim 3, characterized in that in one of the S1 scan and the S2 scan or both of them, data collection is performed at the data matrix number less than the data number of the S0 scan, and at the image reconstruction state, zero data is entered in the remaining region.

9. Imaging method of separation of water and fat in MRI as set forth in claim 3, characterized in that in the S1 scan and the S2 scan, application timing of RF pulse of 180° in the S1 scan is made earlier or later by $\epsilon$ than that of the S0 scan, and the application timing in the S2 scan is made earlier or later by $\epsilon/2$; where $\epsilon$ satisfies the following formula:

$$\epsilon = (4 \cdot \epsilon \cdot f)^{-1}$$

$\rho$: chemical shift quantity of water and fat
f: resonant frequency of proton.

10. Imaging method of separation of water and fat in MRI set forth in claim 4, characterized in that in the S1 scan and the S2 scan, application timing of RF pulse of 180° in the S1 scan is made earlier or later by $\epsilon$ than that of the S0 scan, and the application timing in the S2 scan is made earlier or later by $\epsilon/2$; where $\epsilon$ satisfies the following formula:

$$\epsilon = (4 \cdot \epsilon \cdot f)^{-1}$$

$\rho$: chemical shift quantity of water and fat
f: resonant frequency of proton.

* * * * *